United States Patent
Luo

(10) Patent No.: US 10,224,721 B2
(45) Date of Patent: Mar. 5, 2019

(54) SWITCH CONTROL CIRCUIT AND ELECTRONIC DEVICE USING THE SAME

(71) Applicant: HONGFUJIN PRECISION ELECTRONICS (TIANJIN) CO., LTD., Tianjin (CN)

(72) Inventor: Fei Luo, Shenzhen (CN)

(73) Assignee: HONGFUJIN PRECISION ELECTRONICS (TIANJIN) C, Tianjin (CN)

( * ) Notice: Subject to any disclaimer, the term of this patent is extended or adjusted under 35 U.S.C. 154(b) by 172 days.

(21) Appl. No.: 15/224,666

(22) Filed: Aug. 1, 2016

(65) Prior Publication Data
US 2017/0373505 A1    Dec. 28, 2017

(30) Foreign Application Priority Data
Jun. 28, 2016  (CN) .......................... 2016 1 0484017

(51) Int. Cl.
*H02J 4/00*    (2006.01)
*H01H 47/00*    (2006.01)

(52) U.S. Cl.
CPC ............... *H02J 4/00* (2013.01); *H01H 47/00* (2013.01)

(58) Field of Classification Search
CPC ......... H04L 45/02; H04L 45/22; H04L 45/60; H04L 45/64; H04L 45/66; H04L 47/24
USPC .......................................................... 307/115
See application file for complete search history.

(56) References Cited

U.S. PATENT DOCUMENTS

2004/0207440 A1* 10/2004 Robertson ................. G06F 1/24
327/291

* cited by examiner

*Primary Examiner* — John W Poos
(74) *Attorney, Agent, or Firm* — ScienBiziP, P.C.

(57) ABSTRACT

A switch control circuit to switch off communication channels between a baseboard management controller (BMC) and a backplane chip when not needed includes a logic component and a switch circuit. The switch circuit is configured for coupling between the BMC and the backplane chip in a device. The logic component obtains a logic control signal from the BMC, and outputs a switch signal to the switch circuit to turn on or turn off the switch circuit according to the logic control signal. An electronic device including the switch control circuit is also provided.

13 Claims, 2 Drawing Sheets

SWITCH CONTROL CIRCUIT AND ELECTRONIC DEVICE USING THE SAME

FIELD

The subject matter herein generally relates to switch control circuits and an electronic device using the same.

BACKGROUND

In a server system, a baseboard management controller (BMC) communicates with a backplane chip via an inter-integrated circuit (I2C) bus. In generally, the backplane chip always transmits data to the BMC even though the BMC does not need to communicate with the backplane chip.

BRIEF DESCRIPTION OF THE DRAWINGS

Implementations of the present technology will now be described, by way of example only, with reference to the attached figures.

DETAILED DESCRIPTION

Figure 1:
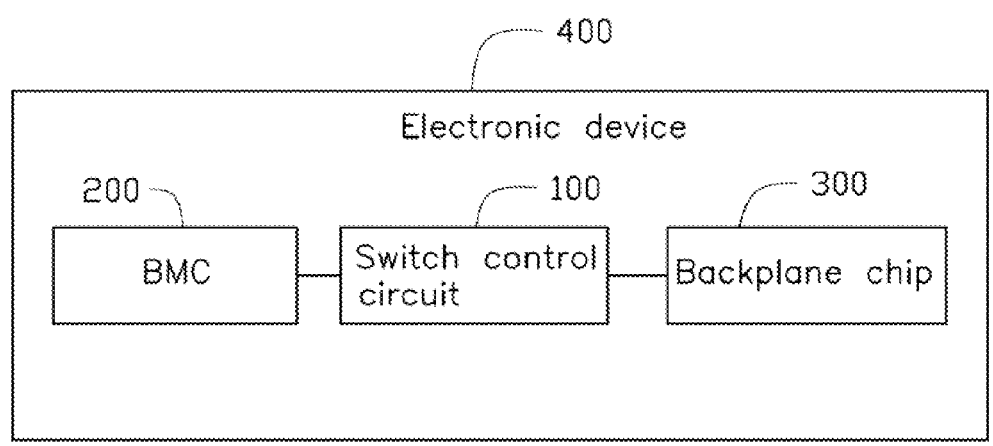
FIG. 1 is a block diagram of an embodiment of an electronic device of the present disclosure, the electronic device including a switch control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 illustrates an electronic device 400 of an embodiment of the present disclosure.

The electronic device 400 can comprise an switch control circuit 100, a baseboard management controller (BMC) 200, and a backplane chip 300. The switch control circuit 100 is installed in the electronic device 400. The switch control circuit 100 is electrically coupled between the BMC 200 and the backplane chip 300 to control communications between the BMC 200 and the backplane chip 300. In at least one embodiment, the electronic device 400 can be a server.

Figure 2:
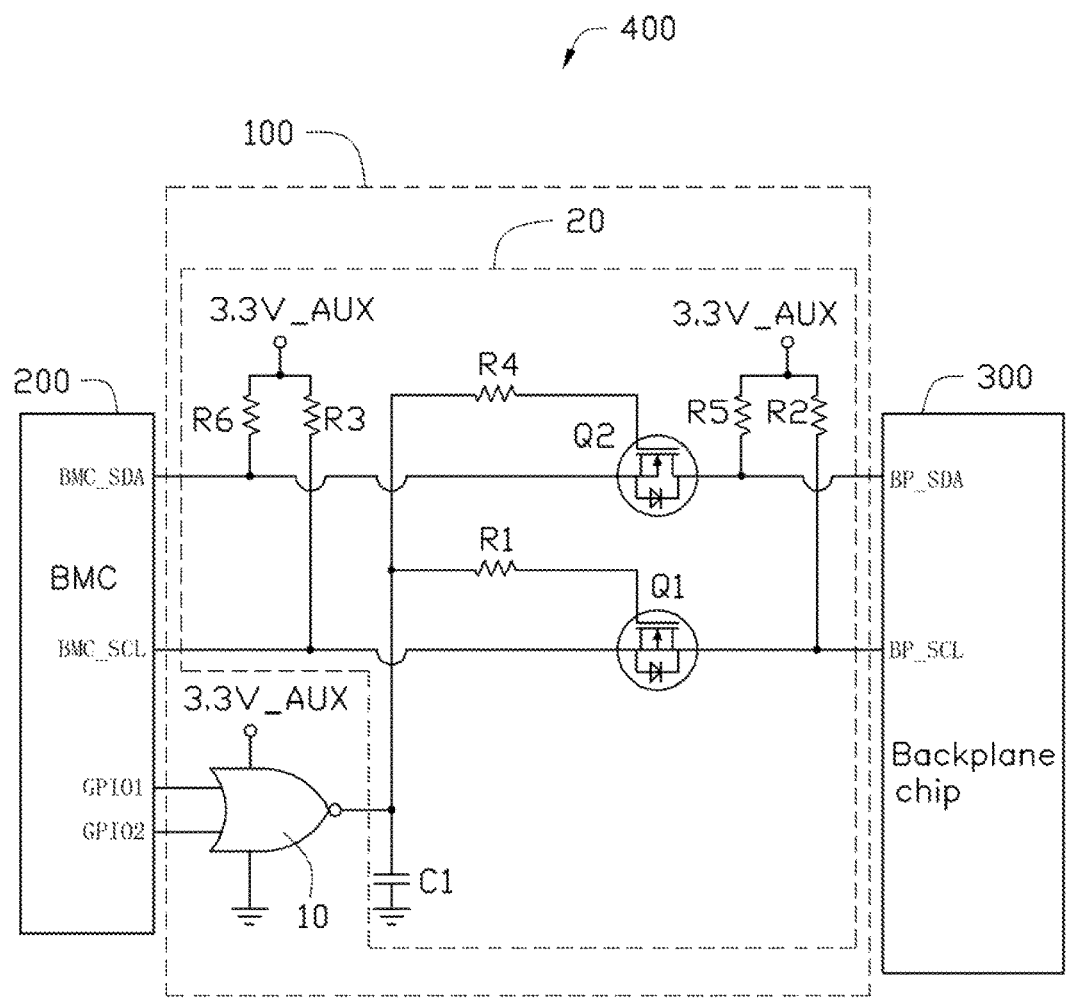
FIG. 2 is a circuit diagram of an embodiment of the switch control circuit of FIG. 1.

FIG. 2 illustrates an embodiment of the switch control circuit 100. The switch control circuit 100 can comprise a logic component 10 and a switch circuit 20. The switch circuit 20 is electrically coupled between the BMC 200 and the backplane chip 300. The logic component 10 is electrically coupled between the BMC 200 and the switch circuit 20 to obtain a logic control signal from the BMC 200. The logic component 10 outputs a switch signal to the switch circuit 20 according to the logic control signal outputted by the BMC 200, to switch on or switch off the switch circuit 20.

In at least one embodiment, the logic component 10 can be a NOR gate.

A logic component first input terminal is electrically coupled to a BMC general purpose input/output terminal (GPIO1). A logic component second input terminal is electrically coupled to another BMC general purpose input/output terminal (GPIO2). A logic component ground terminal is grounded. A logic component power supply terminal is electrically coupled to a power supply 3.3V_AUX. A logic component output terminal is electrically coupled to the switch circuit 20.

The switch circuit 20 comprises a first electronic switch Q1, a second electronic switch Q2, a capacitor C1, and first to sixth resistors R1-R6.

A first electronic switch first terminal is electrically coupled to BMC clock pin BMC_SCL. The first electronic switch first terminal is electrically coupled to the power supply 3.3V_AUX through the first resistor R1. A first electronic switch second terminal is electrically coupled to backplane chip clock pin BP_SCL. The first electronic switch second terminal is electrically coupled to the power supply 3.3V_AUX through the second resistor R2. A first electronic switch third terminal is electrically coupled to the logic component output terminal through third resistor R3. The first electronic switch third terminal is electrically coupled to ground through the third resistor R3 and the capacitor C1.

A second electronic switch first terminal is electrically coupled to BMC data pin BMC_SDA. The second electronic switch first terminal is electrically coupled to the power supply 3.3V_AUX through the fourth resistor R4. A second electronic switch second terminal is electrically coupled to backplane chip data pin BP_SDA. The second electronic switch second terminal is electrically coupled to the power supply 3.3V_AUX through the fifth resistor R5. A second electronic switch third terminal is electrically coupled to the logic component output terminal through sixth resistor R6. The second electronic switch third terminal is electrically coupled to ground through the sixth resistor R6 and the capacitor C1.

In at least one embodiment, the first electronic switch Q1 can be a field effect transistor (FET). The first electronic switch first terminal can be a FET source. The first electronic switch second terminal can be a FET drain. The first electronic switch third terminal can be a FET gate.

In at least one embodiment, the second electronic switch Q2 can also be an FET. The second electronic switch first terminal can be FET source. The second electronic switch second terminal can be FET drain. The second electronic switch third terminal can be FET gate.

In use, when the electronic device BMC 200 needs to communicate with the backplane chip 300, both the BMC GPIO1 and the BMC GPIO2 output, to the logic component first input terminal and the logic component second input terminal, a logic control signal at the low-voltage level, such as logic 0. The logic component 10 outputs a switch signal at high-voltage level, such as logic 1, to turn on the first electronic switch Q1 and the second electronic switch Q2.

Normal communication between the BMC 200 and the backplane chip 300 is thus enabled.

When communication between the electronic device BMC 200 and the backplane chip 300 is not needed, one or both of the BMC GPIO1 and the BMC GPIO2 outputs a logic control signal at high-voltage level, such as logic 1, to the logic component first input terminal or the logic component second input terminal. The logic component 10 outputs a switch signal at low-voltage level, such as logic 0, to turn off the first electronic switch Q1 and the second electronic switch Q2. Communication between the BMC 200 and the backplane chip 300 is thus disabled.

The embodiments shown and described above are only examples. Many details are often found in the art such as the other features of switching circuit in an electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A switch control circuit, configured for coupling a baseboard management controller (BMC) to a backplane chip, comprising:
    a switch circuit coupled between the BMC and the backplane chip; and
    a logic component coupled between the BMC and the switch circuit to obtain a logic control signal from the BMC, and configured to output a switch signal to the switch circuit to turn on or off the switch circuit according to the logic control signal outputted by the BMC;
    wherein the switch circuit is configured to control a connection between the BMC and the backplane chip according to the switch signal outputted by the logic component; and
    wherein the switch circuit comprises a first electronic switch; the first electronic switch comprises a first electronic switch first terminal, a first electronic switch second terminal, and a first electronic switch third terminal; and the first electronic switch first terminal is electrically coupled to a BMC clock pin, the first electronic switch second terminal is electrically coupled to a backplane chip clock pin, the first electronic switch third terminal is electrically coupled to the logic component.

2. The switch control circuit of claim 1, wherein the logic component comprises a logic component first input terminal, a logic component second input terminal, a logic component ground terminal, a logic component power supply terminal, and a logic component output terminal; the BMC comprises a BMC first general purpose input output (GPIO) and a BMC second GPIO; and the logic component first input terminal is electrically coupled to the BMC first GPIO, the logic component second input terminal is electrically coupled to the BMC second, the logic component ground terminal is grounded, the logic component power supply terminal is electrically coupled to a power supply, and the logic component output terminal is electrically coupled to the switch circuit.

3. The switch control circuit claim 2, wherein the switch circuit further comprises a capacitor, a first resistor, a second resistor, and a third resistor; the first electronic switch first terminal is electrically coupled to the power supply through the first resistor, the first electronic switch second terminal is electrically coupled to the power supply through the second resistor, the first electronic switch third terminal is electrically coupled to the logic component output terminal through third resistor, and the first electronic switch third terminal is electrically coupled to ground through the third resistor and the capacitor.

4. The switch control circuit of claim 3, wherein the switch circuit further comprises a second electronic switch, a fourth resistor, a fifth resistor, and a sixth resistor; the second electronic switch comprises a second electronic switch first terminal, a second electronic switch second terminal, and a second electronic switch third terminal; and the second electronic switch first terminal is electrically coupled to a BMC data pin, the second electronic switch first terminal is electrically coupled to the power supply through the fourth resistor, the second electronic switch second terminal is electrically coupled to a backplane chip data pin, the second electronic switch second terminal is electrically coupled to the power supply through the fifth resistor, the second electronic switch third terminal is electrically coupled to the logic component output terminal through sixth resistor, and the second electronic switch third terminal is electrically coupled to ground through the sixth resistor and the capacitor.

5. The switch control circuit of claim 4, wherein the first electronic switch is a field effect transistor (FET), the first electronic switch first terminal is a FET source, the first electronic switch second terminal is a FET drain, and the first electronic switch third terminal is a FET gate.

6. The switch control circuit of claim 5, wherein the second electronic switch is a FET, the second electronic switch first terminal is a FET source, the second electronic switch second terminal is a FET drain, and the second electronic switch third terminal is a FET gate.

7. The switch control circuit of claim 6, wherein when the BMC is required to communicate with the backplane chip, both the BMC first GPIO and the BMC second GPIO outputs the logic control signal at the low-voltage level to the logic component first input terminal and the logic component second input terminal, the logic component outputs a switch signal at the high-voltage level to turn on the first electronic switch and the second electronic switch, and the BMC communicates with the backplane chip normally.

8. The switch control circuit of claim 1, wherein the logic component is a nor gate.

9. A electronic device comprising:
    a baseboard management controller (BMC);
    a backplane chip; and
    a switch control circuit coupled between the baseboard management controller (BMC) and the backplane chip and comprising:
        a switch circuit configured for coupling between the electronic device BMC and the device backplane chip; and
        a logic component coupled between the BMC and the switch circuit to obtain a logic control signal from the BMC, and configured to output a switch signal to the switch circuit to turn on or off the switch circuit according to the logic control signal outputted by the BMC;

wherein the switch circuit is configured to control a connection between the BMC and the backplane chip according to the switch signal outputted by the logic component; and wherein the switch circuit comprises a first electronic switch; the first electronic switch comprises a first electronic switch first terminal, a first electronic switch second terminal, and a first electronic switch third terminal; and the first electronic switch first terminal is electrically coupled to a BMC clock pin, the first electronic switch second terminal is electrically coupled to a backplane chip clock pin, the first electronic switch third terminal is electrically coupled to the logic component.

10. The electronic device claim 9, wherein the switch circuit further comprises a capacitor, a first resistor, a second resistor, and a third resistor; the first electronic switch first terminal is electrically coupled to the power supply through the first resistor, the first electronic switch second terminal is electrically coupled to the power supply through the second resistor, the first electronic switch third terminal is electrically coupled to the logic component output terminal through third resistor, and the first electronic switch third terminal is electrically coupled to ground through the third resistor and the capacitor.

11. The electronic device of claim 10, wherein the switch circuit further comprises a second electronic switch, a fourth resistor, a fifth resistor, and a sixth resistor; the second electronic switch comprises a second electronic switch first terminal, a second electronic switch second terminal, and a second electronic switch third terminal; and the second electronic switch first terminal is electrically coupled to a BMC data pin, the second electronic switch first terminal is electrically coupled to the power supply through the fourth resistor, the second electronic switch second terminal is electrically coupled to a backplane chip data pin, the second electronic switch second terminal is electrically coupled to the power supply through the fifth resistor, the second electronic switch third terminal is electrically coupled to the logic component output terminal through sixth resistor, and the second electronic switch third terminal is electrically coupled to ground through the sixth resistor and the capacitor.

12. The electronic device of claim 11, wherein the first electronic switch is a field effect transistor (FET), the first electronic switch first terminal is a FET source, the first electronic switch second terminal is a FET drain, and the first electronic switch third terminal is a FET gate; and the second electronic switch is a FET, the second electronic switch first terminal is a FET source, the second electronic switch second terminal is a FET drain, and the second electronic switch third terminal is a FET gate.

13. The electronic device of claim 12, wherein when the BMC is need to communicate with the backplane chip, both the BMC first GPIO and the BMC second GPIO outputs the logic control signal at the low-voltage level to the logic component first input terminal and the logic component second input terminal, the logic component outputs a switch signal at the high-voltage level to turn on the first electronic switch and the second electronic switch, and the BMC communicates with the backplane chip normally.

* * * * *

UNITED STATES PATENT AND TRADEMARK OFFICE
CERTIFICATE OF CORRECTION

PATENT NO.       : 10,224,721 B2
APPLICATION NO.  : 15/224666
DATED            : March 5, 2019
INVENTOR(S)      : Fei Luo Page 1 of 1

It is certified that error appears in the above-identified patent and that said Letters Patent is hereby corrected as shown below:

On the Title Page

Please replace item (73) regarding "Assignees" with the following:
(73) HONGFUJIN PRECISION ELECTRONICS (TIANJIN) CO., LTD., Tianjin, (CN)

Signed and Sealed this
Second Day of June, 2020

Andrei Iancu
*Director of the United States Patent and Trademark Office*